US007436219B2

(12) United States Patent
Chen et al.

(10) Patent No.: US 7,436,219 B2
(45) Date of Patent: Oct. 14, 2008

(54) LEVEL SHIFTER CIRCUIT

(75) Inventors: Wei-Chieh Chen, Tao-Yuan Hsien (TW); Kai-Ming Liu, Hsin-Chu Hsien (TW); Chen-Hsien Han, Kao-Hsiung (TW); Wei-Yang Ou, Kao-Hsiung (TW); Sung-En Liu, Hsin-Chu (TW)

(73) Assignee: ILI Technology Corp., Jhubei, Hsinchu County (TW)

( * ) Notice: Subject to any disclaimer, the term of this patent is extended or adjusted under 35 U.S.C. 154(b) by 145 days.

(21) Appl. No.: 11/462,998

(22) Filed: Aug. 7, 2006

(65) Prior Publication Data

US 2008/0030253 A1 Feb. 7, 2008

(51) Int. Cl.
*H03K 19/0175* (2006.01)

(52) U.S. Cl. .......................... 326/105; 326/68; 345/100

(58) Field of Classification Search ............. 326/68–74, 326/82, 83, 105, 112, 119, 121; 345/100
See application file for complete search history.

(56) References Cited

U.S. PATENT DOCUMENTS

| | | | | |
|---|---|---|---|---|
| 7,030,661 | B1 * | 4/2006 | Doyle | 327/102 |
| 7,321,255 | B2 * | 1/2008 | Maki | 327/538 |
| 2004/0227546 | A1 * | 11/2004 | Nanba et al. | 327/103 |

* cited by examiner

*Primary Examiner*—Don P Le
(74) *Attorney, Agent, or Firm*—Winston Hsu

(57) ABSTRACT

A level shifter circuit includes: K level shifter units for receiving K input signals having a first voltage level range and outputting K output signals having a second voltage level range, wherein the second voltage level range is greater than the first voltage level range. Each level shifter unit is utilized to output an output signal at an output end and includes: a first switch, coupled between the output end and a first voltage source for controlling the electrical connection between the first voltage source and the output end according to an input signal; and (K−1) second switches, connected in parallel between the output end and a second voltage source, for respectively controlling its ON/OFF status according to (K−1) output signals except for the output signal. K is an integer.

10 Claims, 7 Drawing Sheets

LEVEL SHIFTER CIRCUIT

BACKGROUND OF THE INVENTION

1. Field of the Invention

The present invention relates to a level shifter circuit, and more particularly, to a level shifter circuit requiring a smaller circuit area.

2. Description of the Prior Art

Level shifter circuits are applied between two digital circuits in order to shift a voltage level of an input signal to a different output level. In general, the voltage level defines the logic value of the signal (ex: logic value 1 or 0). Different digital circuits have different ways to define the logic values. For example, if the voltage level of the signal is larger than 2.5V in the first digital circuit, the logic value of the signal is 1. However, in another digital circuit, if the voltage level of the signal is larger than 5V, the logic value of the signal is 1.

The same signal can therefore have different logic values in different digital circuits. For example, a signal having a 2.5V voltage level can have a corresponding logic value as 1 in a first digital circuit, while in a second digital circuit, the logic value may be 0. Obviously, if the signal is not level-shifted before being inputted from the first digital circuit to the second digital circuit, the different logic value definitions between the two digital circuits may cause errors, resulting in further operational errors for the whole circuit.

Therefore, a level shifter circuit is used to shift voltage level of a signal between digital circuits to solve the above-mentioned problem of different logic value definitions. Using the above example for instance, the level shifter circuit can shift a 2.5 V voltage level of the signal in the first digital circuit to a 5V voltage level for the second circuit. As a result, when the signal is outputted into the second digital circuit, the 5V voltage level of signal is correctly judged as 1. As known to those skilled in this art, level shifter circuits are applied in various circuits, including signal exchanging between a chip and an external circuit or between internal and external circuits of a liquid crystal display (LCD) panel.

Please refer to FIG. 1. FIG. 1 is a schematic diagram of a two-to-one, six bit digital-to-analog converter (DAC) 110 using previously described level shifter circuits 120. In this example, the digital-to-analog converter 110 supports 64 different outputs, and is implemented by six stages of two-to-one switches. First, a decoder 130 receives a six-bit digital signal and converts it into input signals $I_0$, $I_{0b}$, $I_1$, $I_{1b}$, $I_2$, $I_{2b}$, $I_3$, $I_{3b}$, $I_4$, $I_{4b}$, $I_5$, $I_{5b}$, for the level shifter circuits 120. Because the voltage levels of the input signals $I_0$~$I_5$, $I_{0b}$~$I_{5b}$ are lower, the inner switches of the digital-to-analog converter 110 can't be controlled by these input signals $I_0$~$I_5$, $I_{0b}$~$I_{5b}$. The level shifter circuits 120, therefore, are utilized to shift the voltage levels of the input signals, in order to generate the output signals $Q_0$~$Q_5$, $Q_{0b}$~$Q_{5b}$ that can turn on the inner switches of the digital-to-analog converter 110. Furthermore, a switch from every two switches in each stage turns due to control signals $Q_0$~$Q_5$, $Q_{0b}$~$Q_{5b}$ from the level shifter circuits 120. After propagation through six stages of switches, the digital-to-analog converter 110 is able to select one of a plurality of reference voltages (ref1, ref2, . . . , ref64) as an analog voltage output.

Please note in the above example, the signal $I_{xb}$ is an inverted signal from $I_x$, and the level shifter circuits 120 output signals $Q_0$~$Q_5$, $Q_{0b}$~$Q_{5b}$. The circuit designer decides what kind of single as a control voltage of each inner switch. For example, if the inner switches of the digital-to-analog converter 110 are implemented by NMOS transistors, the circuit designer can use the output signals $Q_0$~$Q_5$ to control the NMOS switches. If the inner switches of the digital-to-analog converter 110 are implemented by PMOS transistors, the circuit designer can use the inverted output signals $Q_0$~$Q_5$ to control the PMOS switches.

Please refer FIG. 2. FIG. 2 is a detailed circuit diagram of the level shifter circuit 120 in FIG. 1. As FIG. 2 shows, the level shifter circuit 120 includes four transistors (i.e., level shifter units) m1~m4. The gates of the PMOS transistors m1 and m2 are coupled to the opposing transistors drain. The gates of the NMOS transistors m3 and m4 are the input ends of the level shifter circuit 120, and the drains are the output ends. The control signals $I_0$ and $I_{0b}$ inputted to the input ends control the ON/OFF status of the PMOS transistors m1 and m2 to generate the control signals $Q_0$ and $Q_{0b}$ at the output ends.

However, the above level shifter circuit 120 has its shortcomings. First, the level shifter circuit 120 must output the control signal having a high voltage level. Therefore, the inside components almost are high voltage components for handling high voltages. This requires the sources and drains of the inner transistors to occupy a larger area, further increasing production costs. The transistors of the above level shifter unit 120 would otherwise be coupled to each other in a cross-coupling configuration. When the control signals $I_0$ and $I_{0b}$ at the input ends have level transition (ie. a transition from a high voltage level to a low one or from a low voltage level to a high one), the two separate routes of the level shifter circuit 120 generate a huge transient current, respectively.

In addition, the digital-to-analog converter 110 in FIG. 1 adopts a two-to-one architecture, and the total amount of inner switches for the six stages are 64+32+16+8+4+2=126 pieces. As known to one in the related art, the inner high voltage switches occupy an excessive area. The conventional solution is to utilize other architectures. Please refer to FIG. 3. FIG. 3 is a schematic diagram of a prior art four-to-one, six bit digital-to-analog converter 310. Obviously, because the four-to-one architecture is implemented, the digital-to-analog converter 310 only needs four stages, and the total amount of the inner switches decrease to 64+16+4=84 pieces, decreasing the consuming area.

Unfortunately, the digital-to-analog converter 310 needs more level shifter circuits 120 to shift voltage levels of control signals for the switches of every stage. As FIG. 3 shows, the amount of the level shifter circuits 120 becomes twice the original amount. Moreover, the inside of the level shifter circuit 120 is made up by high voltage components, so the increased amount of level shifter circuits 320 increases the occupied area. This may not be a satisfactory solution for a manufacturer of digital-to-analog converters desiring a smaller circuit area.

SUMMARY OF THE INVENTION

It is therefore on object of the present invention to provide a level shifter circuit having a reduced area and decreased transient current to solve the above-mentioned problems.

According to the claimed invention, a level shifter circuit is disclosed. The level shifter circuit includes: K shifter units, for receiving K input signals having a first voltage level range and outputting K output signals having a second voltage level range, where the second voltage level range is greater than the first voltage level range. Each shifter unit is utilized to output an output signal at an output end. Each shifter includes: a first switch, coupled between the output end and a first voltage source, for controlling the electrical connection between the first voltage source and the output end according to an input signal; and (K−1) second switches, connected in parallel between the output end and a second voltage source, for respectively controlling its ON/OFF status according to the other (K−1) output signal except for the output signal; wherein K is an integer.

According to the claimed invention, a level shifter circuit is disclosed. The level shifter circuit includes: K shifter units, for receiving K input signals having a first voltage level range and outputting K output signals having a second voltage level range, where the second voltage level range is greater than the first voltage level range. Each shifter unit is utilized to output an output signal at an output end. Each shifter includes: a first switch, coupled between the output end and a first voltage source for controlling the electrical connection between the first voltage source and the output end according to an input signal; and (K−1) second switches connected in serial between the output end and a second voltage source, for respectively controlling its ON/OFF status according to the other (K−1) output signal except for the output signal; wherein K is an integer.

The level shifter circuit of the present invention not only allows normal operation of the digital-to-analog converter, but also avoids a large transient current. The level shifter circuit of the present invention also reduces circuit area and save on related manufacturing costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
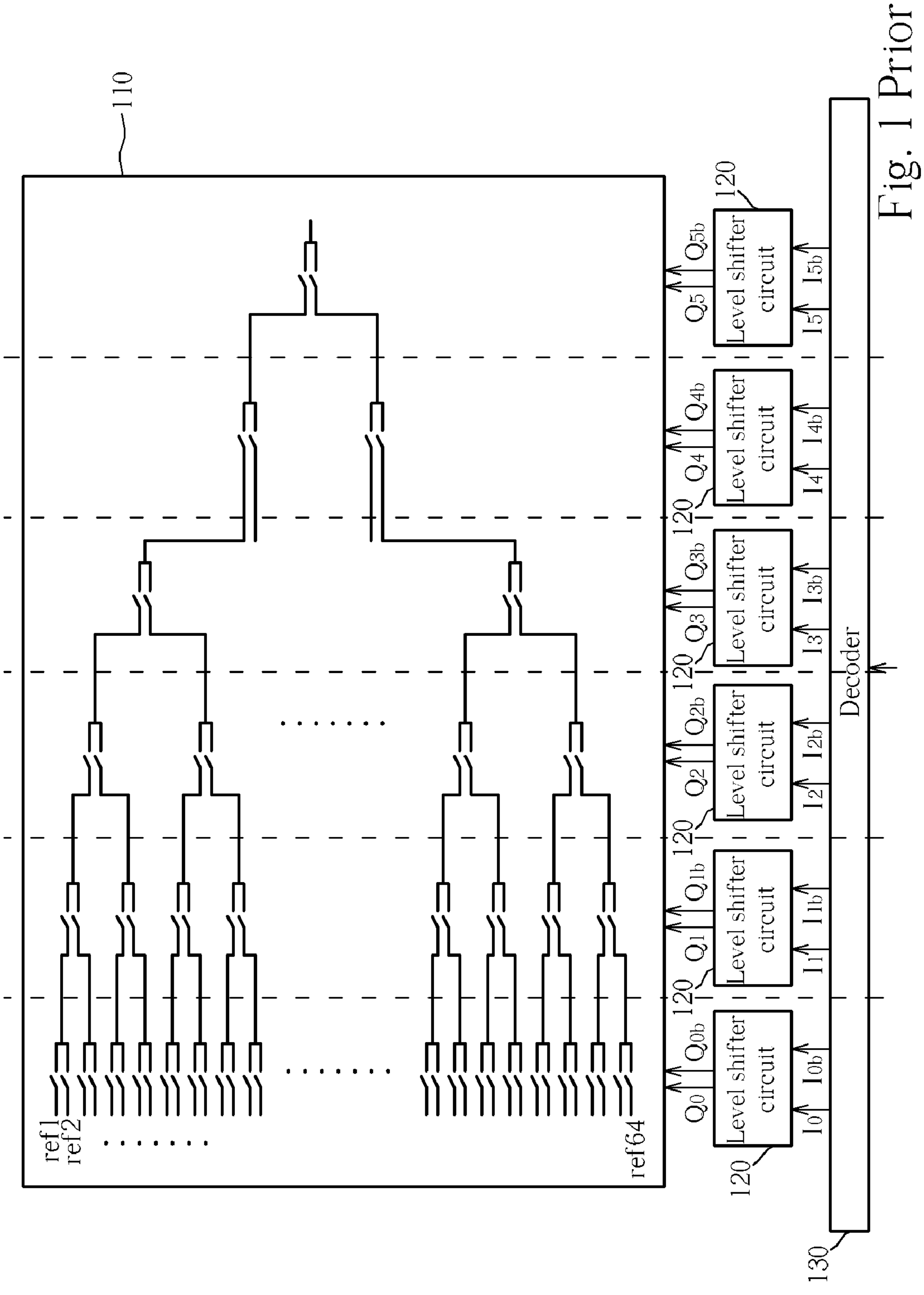
FIG. 1 is a schematic diagram of a two-to-one, six-bit digital-to-analog converter using the prior art level shifter circuits.
Figure 2:
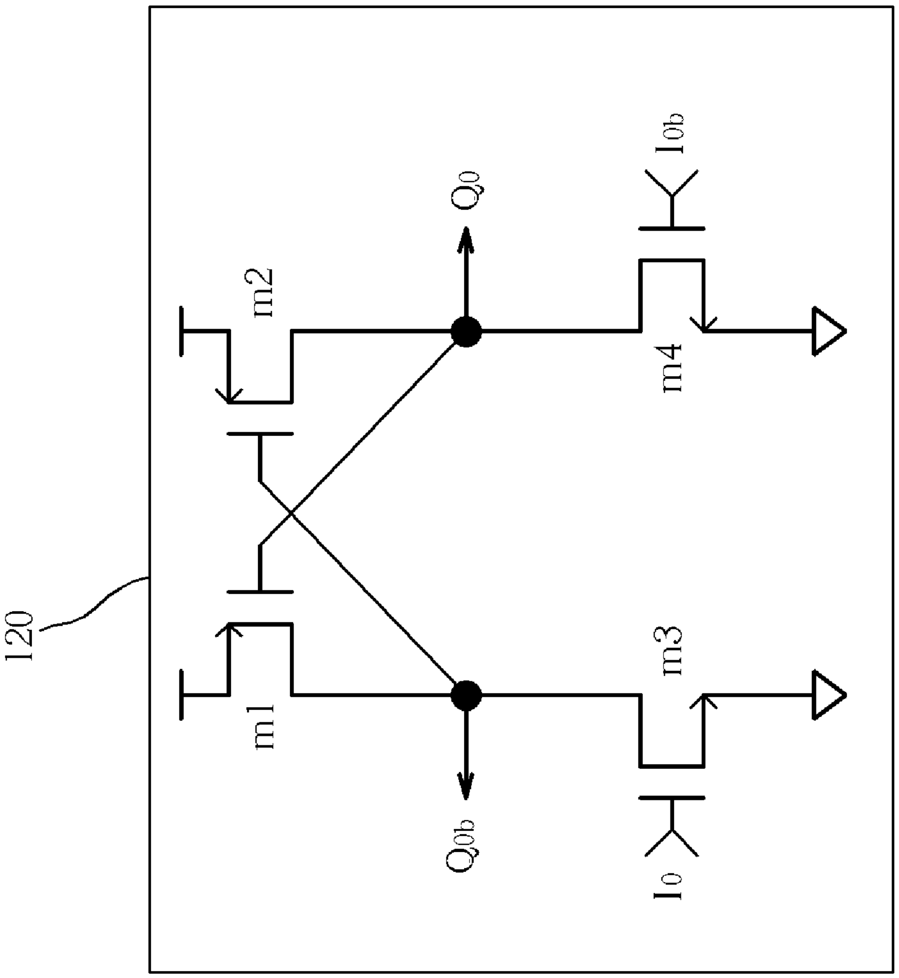
FIG. 2 is a circuit diagram of a level shifter circuit in FIG. 1.
Figure 3:
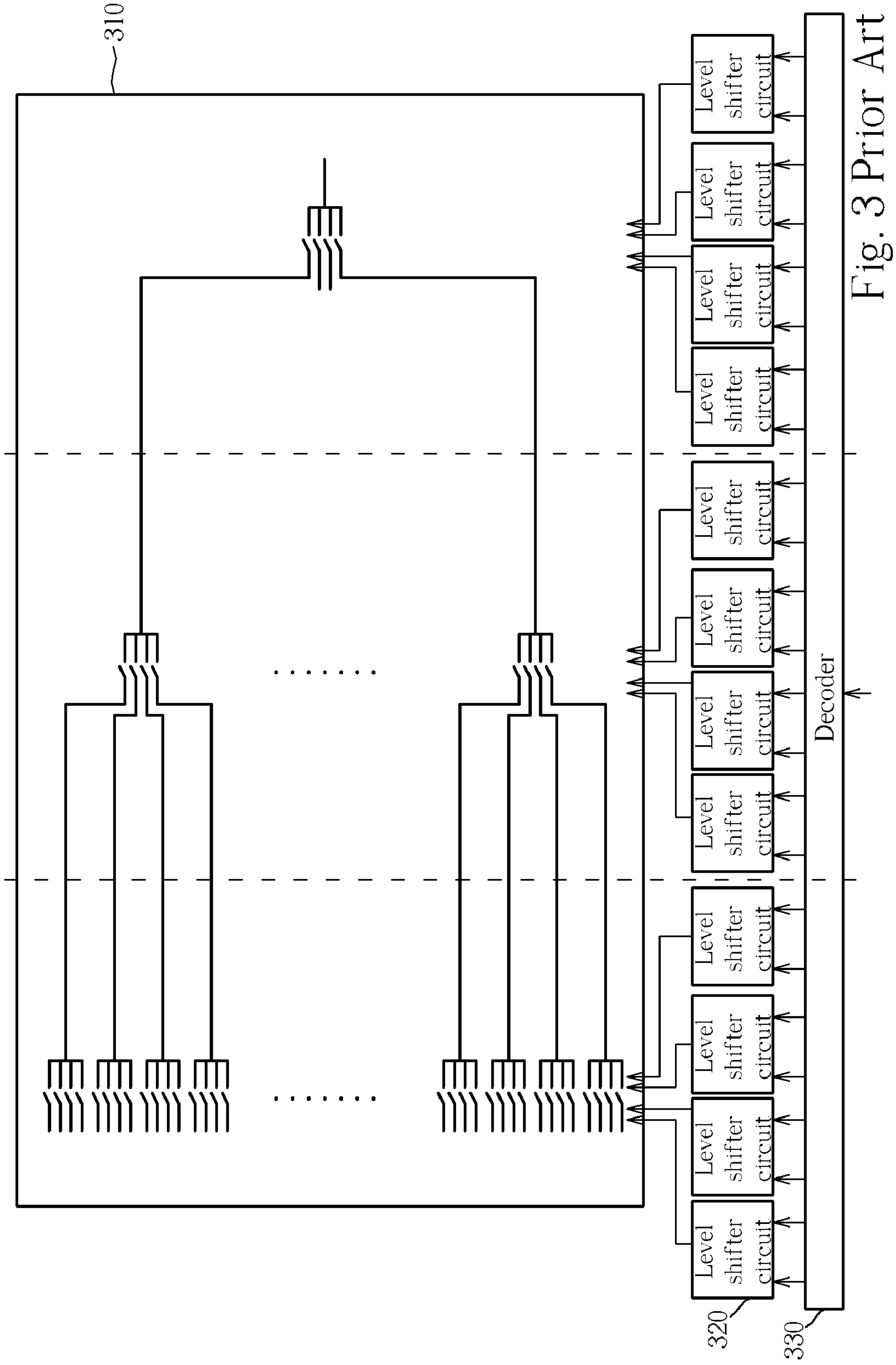
FIG. 3 is a schematic diagram of a prior art four-to-one six-bit digital-to-analog converter.
Figure 4:
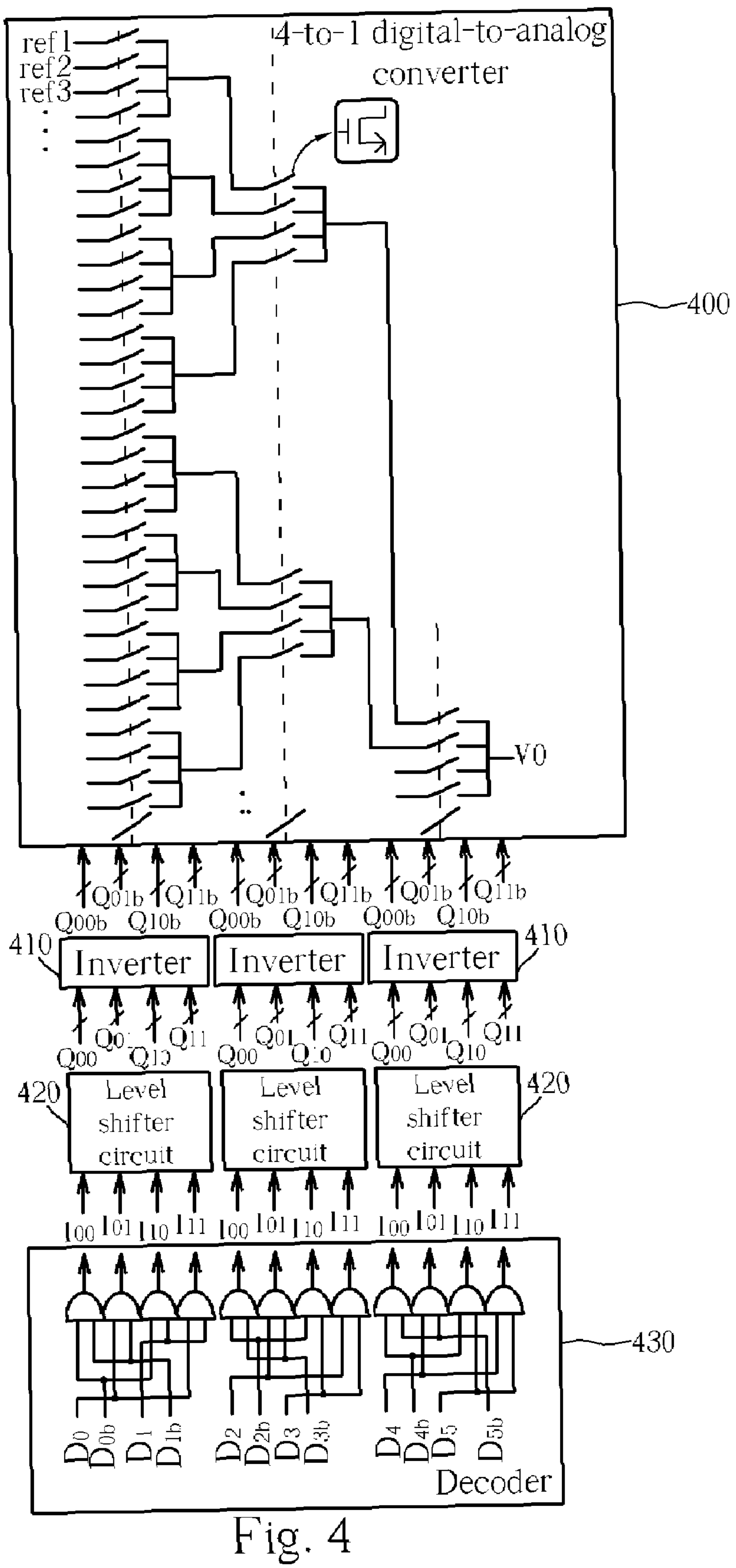
FIG. 4 is a schematic diagram of a four-to-one six-bit digital-to-analog converter using level shifter circuits according to a first embodiment of the present invention.

Please refer to FIG. 4. FIG. 4 is a schematic diagram of a four-to-one, six bit digital-to-analog converter 400 using the level shifter circuits 420 according to a first embodiment of the present invention. First, a decoder 430 receives a six-bit digital signal $D_0$~$D_5$ (please notice $D_0$~$D_{5b}$ of FIG. 1 are the inverted bits of the digital signal $D_0$~$D_5$). They are converted to input signals $I_{00}$~$I_{11}$ of the level shifter circuit 420 by the decoder 430. The voltage levels of the input signals $I_{00}$~$I_{11}$ are not the same voltage levels suitable for the inner switches in the digital-to-analog converter 400, so the level shifter circuits 420 convert the signals $I_{00}$~$I_{11}$ into control signals $Q_{00}$~$Q_{11}$ having high voltage levels to represent logic high '1'. However, when the control signals $Q_{00}$~$Q_{11}$ from the level shifter circuits 420 are not large enough to turn on the inner switches, the inverters 410 are able to receive the control signals $Q_{00}$~$Q_{11}$ to generate control signals $Q_{00b}$~$Q_{11b}$, to control ON/OFF status of the inner switches. In each stage, one switch from every four switches is turned on because of the control signals $Q_{00b}$~$Q_{11b}$ generated from the level shifter circuits 420. After operation from the three stages, the digital-to-analog converter 400 is able to output an analog voltage from a plurality of reference voltages (ref1, ref2, . . . , ref64).

Please note that each switch is made by a high-voltage NMOS transistor. Also, a detailed circuit configuration of the decoder 430 is shown in FIG. 4. Because its functional operation is well known to those skilled in the art, further detail is thus omitted for brevity.

Figure 5:
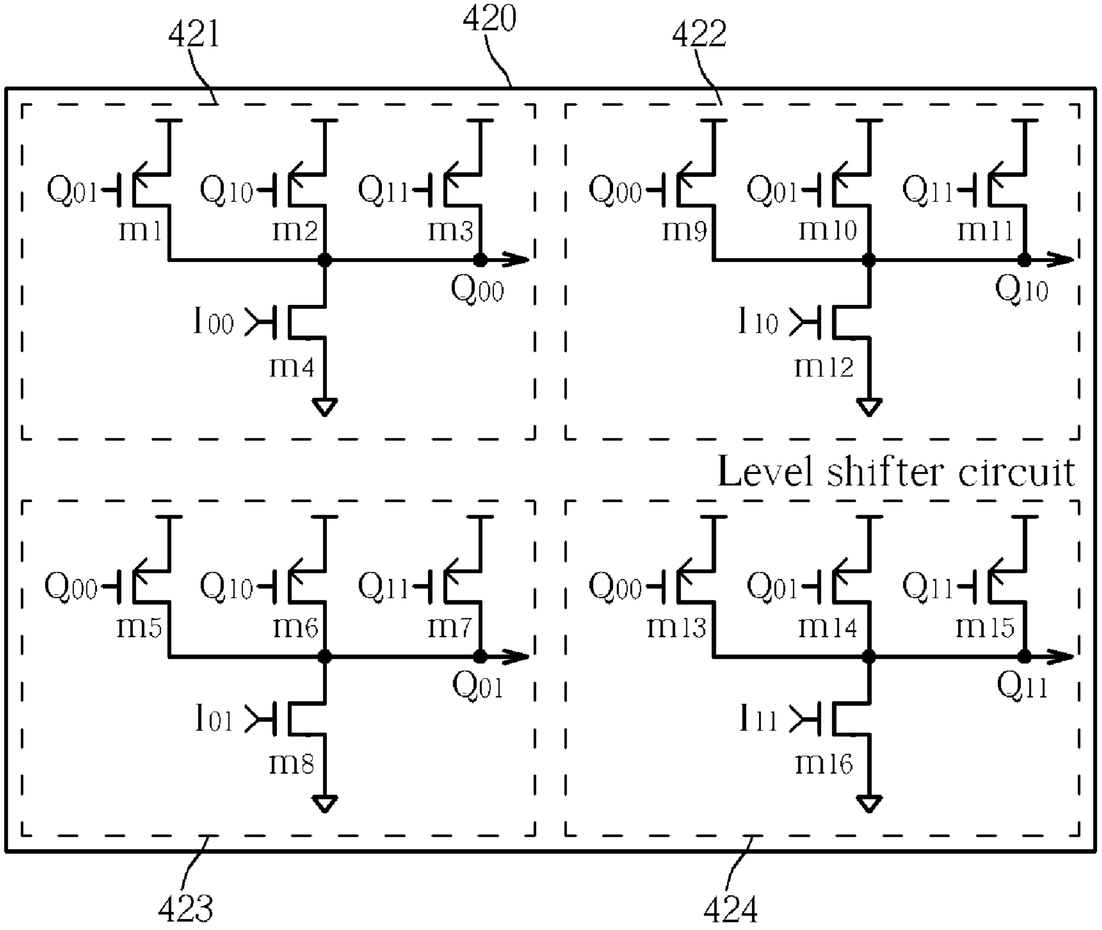
FIG. 5 is a detailed circuit diagram of a level shifter circuit in FIG. 4.

Please refer to FIG. 5. FIG. 5 is a detailed circuit diagram of the level shifter circuit 420 shown in FIG. 4. As FIG. 5 shows, the level shifter circuit 420 includes four level shifter units 421-424 each including four respective transistors m1-m4, m5-m8, m9-m12 and m13-m16. Transistors m4, m8, m12 and m16 are NMOS transistors, while other transistors are PMOS transistors. As FIG. 5 shows, the PMOS transistors m1-m3, m5-m7, m9-m11, and m13-m15 are connected in parallel, and their gates are respectively coupled to the control signals from the other level shifter units. For example, the gates of the PMOS transistors m1-m3 are each respectively coupled to the control signals $Q_{01}$, $Q_{10}$, and $Q_{11}$, and other PMOS transistors m5-m7, m9-m11, and m14-m16 similarly and respectively connected to the control signals $Q_{01}$, $Q_{10}$, and $Q_{11}$ as described above.

If the input bits $D_0$ and $D_1$ are logic values 0 and 0, the decoder 330 is able to generate the control signal $I_{00}$ corresponding to the logic value 1, while other control signals $I_{01}$-$I_{11}$ correspond to the logic value 0. The gate of the NMOS transistor m4 is coupled to the control signal $I_{00}$, such that the NMOS transistor m4 turns on to make the control signal $Q_{00}$ coupled to ground (0 V). In addition, the gates of the PMOS transistors m1-m3 are coupled to the control signal $Q_{00}$ and are turned on accordingly. The control signals $Q_{01}$-$Q_{11}$ are therefore coupled to the exterior voltage source to have logic values 1. In this embodiment, if the voltage level of the exterior voltage source is higher than the voltage level of the control signals $I_{00}$-$I_{11}$, the control signals $Q_{01}$-$Q_{11}$ hold higher voltage levels. The goal of shifting voltage levels using the level shifter circuit 420 is achieved.

As described above, the control signals $Q_{01}$-$Q_{11}$ respectively correspond to logic values 0, 1, 1, and 1. The control signals $Q_{00}$-$Q_{11}$ processed by inverters 410 become inverted control signals $Q_{00b}$-$Q_{11b}$ corresponding logic values 1, 0, 0, 0, respectively. Regarding the switches implemented by NMOS transistors, one switch of every four switches turns on because of the control signals $Q_{00b}$-$Q_{11b}$. This allows the digital-to-analog converter 400 to operate normally.

Please note that the drains of the PMOS transistors m1-m3, m5-m7, m9-m11, and m13-m15 are electrically connected to each other. Therefore, the area consumed by the drains decreases. The decoder 430 is more complex, but doesn't utilize high voltage components to prevent additional costs.

Figure 6:
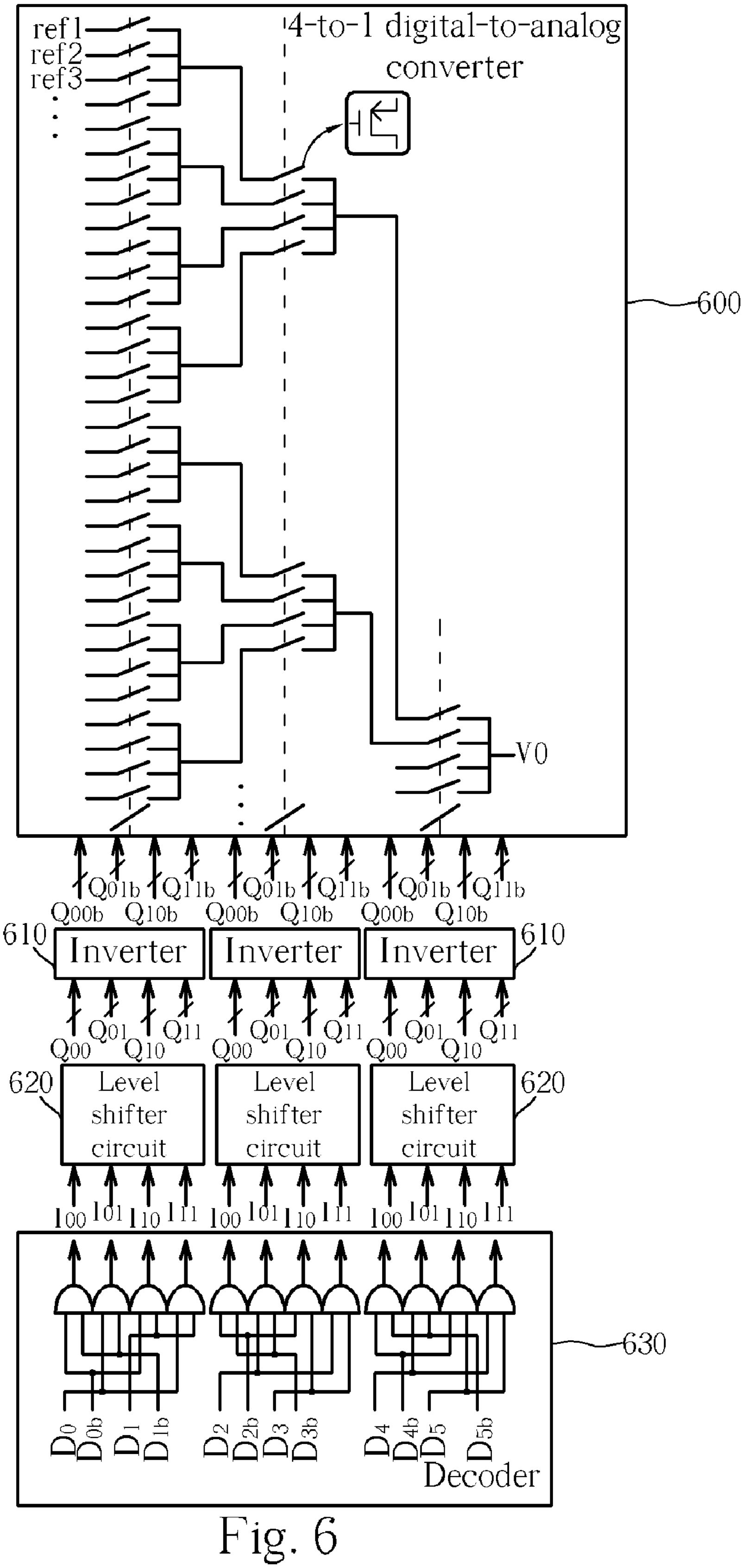
FIG. 6 is a schematic diagram of a four-to-one six-bit digital-to-analog converter using level shifter circuits according to a second embodiment of the present invention.

Please refer to FIG. 6. FIG. 6 is a schematic diagram of a four-to-one, six-bit digital-to-analog converter 600 using the level shifter circuits 620 according to a second embodiment of the present invention. Using the same method, the decoder 630 receives a six-bit digital signal $D_0$-$D_5$ (please note, the $D_{0b}$-$D_{5b}$ signals of FIG. 6 are the inverted signals of the digital signals $D_0$-$D_5$), and converts them to control signals $I_{00}$-$I_{11}$ having a first voltage level. Similarly, the voltage levels of the control signals $I_{00}$-$I_{11}$ are not the voltages suitable for the inner switches in the digital-to-analog converter 600. The level shifter circuits 620 convert the control signals $I_{00}$-$I_{11}$ into control signals $Q_{00}$-$Q_{11}$ having high voltage levels. Furthermore, when control signals $Q_{00}$-$Q_{11}$ from the level shifter circuits 620 are not large enough to turn on the inner switches, the inverters 610 are able to receive the control signals $Q_{00}$-$Q_{11}$ to generate control signals $Q_{00b}$-$Q_{11b}$ to control ON/OFF status of the inner switches. In each stage, one out of every four switches turns on because of control signals $Q_{00b}$-$Q_{11b}$. After operation of the three stages, the digital-to-analog converter 500 is able to output an analog voltage output selected from a plurality of reference voltages (ref1, ref2, . . . , ref64).

Please note, each switch is made by a high-voltage PMOS transistor in this embodiment. The detailed circuit configuration of the decoder 630 is shown in FIG. 6. As its functional operation is well known to those skilled in the art, further detail is thus omitted for brevity.

Figure 7:
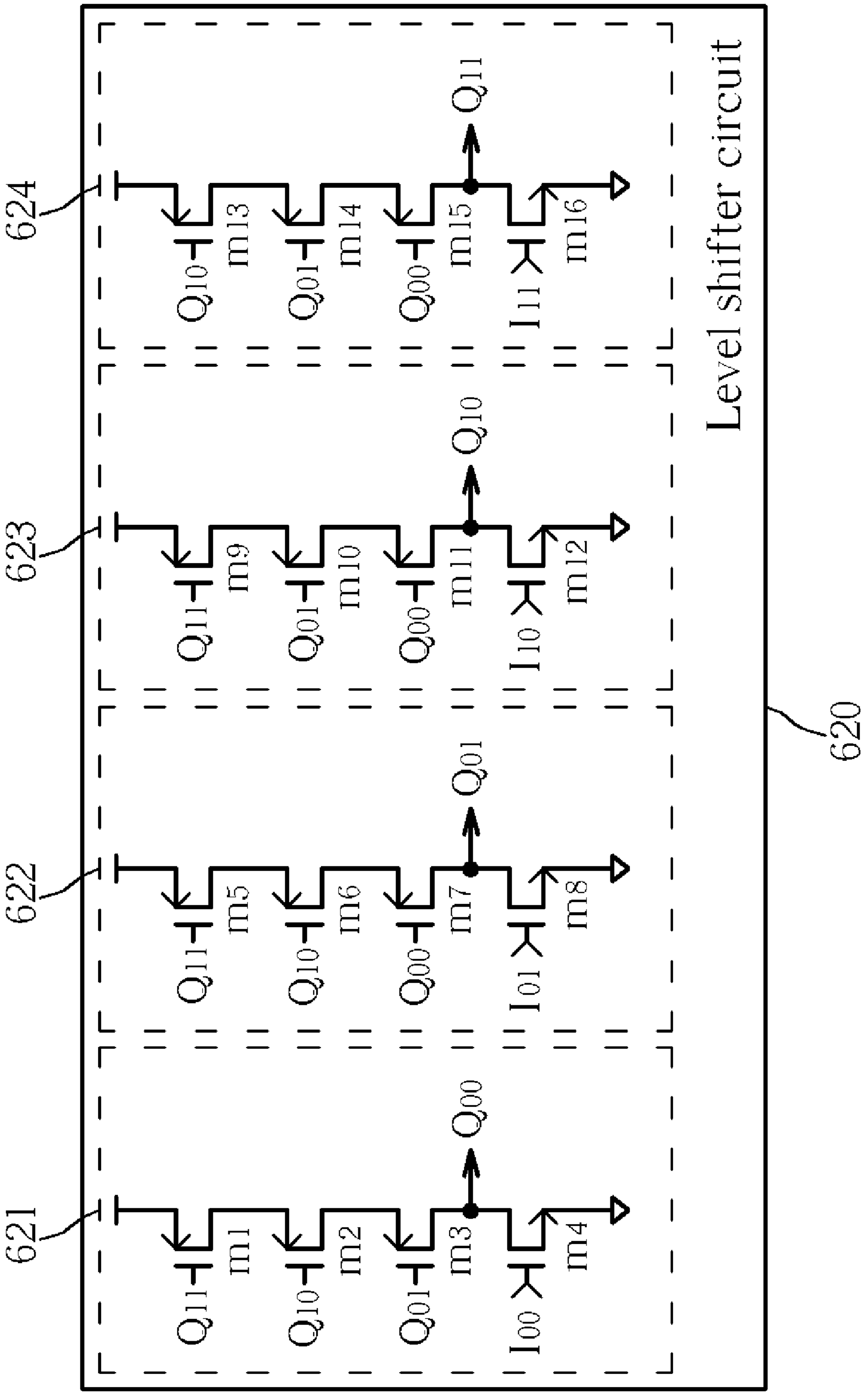
FIG. 7 is a detailed circuit diagram of a level shifter circuit in FIG. 6.

Please refer to FIG. 7. FIG. 7 is a detailed circuit diagram of the level shifter circuit 620 of FIG. 6. As FIG. 6 shows, the level shifter circuit 620 includes four level shifter units 621-624 each including four transistors m1-m4, m5-m8, m9-m12, and m13-m16, respectively. The transistors m4, m8, m12, and m16 are NMOS transistors, while the other transistors are PMOS transistors. As FIG. 6 shows, the PMOS transistors m1-m3, m5-m7, m9-m11, and m13-m15 are connected in series, with their gates respectively coupled to the control signals from other level shifter units. For example, the gates of the PMOS transistors m1-m3 are respectively coupled to control signals $Q_{01}$-$Q_{11}$, and other PMOS transistors m5-m7, m9-m11, m14-m16 similarly connected to control signals $Q_{01}$-$Q_{11}$ in the above manner.

If the input bits $D_0$ and $D_1$ are logic values 0 and 0, the decoder 630 is able to generate the control signal $I_{00}$ corresponding to the logic value 0, while the other control signals $I_{01}$-$I_{11}$ correspond to the logic value 1. The gates of the NMOS transistors m8, m12, m16 are coupled to the control signals $I_{00}$-$I_{11}$, such that NMOS transistors m8, m12, and m16 are turned on to make the control signals $Q_{01}$-$Q_{11}$ coupled to ground (i.e., 0V). In addition, the gates of PMOS transistors m1-m3 are coupled to the control signals $Q_{01}$-$Q_{11}$ and turned on. The control signals $Q_{01}$-$Q_{11}$ are coupled to an exterior voltage source to hold logic values 1. In the same way, if the voltage level of the exterior voltage source is higher than the voltage level of the control signals $I_{00}$-$I_{11}$, the control singles $Q_{01}$-$Q_{11}$ correspond to higher voltage levels. The goal of shifting voltage levels through the level shifter circuit 620 is achieved.

As described above, the control signals $Q_{00}$-$Q_{11}$ respectively correspond to logic values 1, 0, 0, and 0. The control signals $Q_{00}$-$Q_{11}$ processed by inverters 610 become inverted control signals $Q_{00b}$-$Q_{11b}$ corresponding to the logic values 0, 1, 1, and 1, respectively. Regarding the switches implemented by PMOS transistors, one switch of every four switches turns on because of the control signals $Q_{00b}$-$Q_{11b}$. This allows the digital-to-analog converter 600 to operate normally.

Please note, the aforementioned four-to-one digital-to-analog converter is only one embodiment of the present embodiment, and is not meant to be taken as a limitation of the present invention. In reality, every $2^n$-to-1 digital-to-analog converter can use the level shifting mechanism of the present invention. These alternative designs all fall in the scope of the present invention.

In addition, above-mentioned inverters 410, 610 are used for further increasing the voltage levels to turn on the inner switches of the digital analog switches 400, 600. However, the inverters 410, 610 are optional components. In other words, if the output signals of the level shifter circuits 420, 620 already have the capability of turning on the inner switches, it does not require inverters 410, 610 to further boost the voltage level. Again, such an alternative design still falls in the scope of the present invention.

Compared to the prior art, the level shifter circuit of the present invention not only makes a $2^n$-to-1 digital-to-analog converter work normally, but also solves the problem of huge transient currents. Additionally, the level shifter circuit of the present invention doesn't require a huge chip area, decreasing the cost of manufacture accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter circuit, comprising:

K level shifter units, receiving K input signals having a first voltage level range and outputting K output signals having a second voltage level range, the second voltage level range being greater than the first voltage level range, each level shifter unit being utilized to output an output signal at an output end and comprising:

a first switch, coupled between the output end and a first voltage source, for controlling if the first voltage source is coupled to the output end according to an input signal; and (K−1) second switches, connected in parallel between the output end and a second voltage source, each second switch for controlling its own ON/OFF status according to (K−1) output signals except for the output signal;

wherein K is an integer not less than 4.

2. The level shifter circuit of claim 1, wherein each switch is a transistor.

3. The level shifter circuit of claim 2, wherein the first switch is an N-channel metal-oxide-semiconductor (NMOS) transistor, and its gate receives the input single.

4. The level shifter circuit of claim 2, wherein each second switch is a P-channel metal-oxide-semiconductor (PMOS), its drain is coupled to the output end, its source is coupled to the second voltage source, and its gate receives an output signal of the (K−1) output singles.

5. The level shifter circuit of claim 1, being applied to a digital-to-analog converter.

6. A level shifter circuit, comprising:

K level shifter units, receiving K input signals having a first voltage level range and outputting K output signals having a second voltage level range, the second voltage level range being greater than the first voltage level range, each level shifter unit being utilized to output an output signal at an output end and comprising:

a first switch, coupled between the output end and a first voltage source, for controlling if the first voltage source is coupled to the output end according to an input signal; and (K−1) second switches, connected in series between the output end and a second voltage source, each second switch for controlling its own ON/OFF status according to (K−1) output signals except for the output signal;

wherein K is an integer.

7. The level shifter circuit of claim 6, wherein each switch is a transistor.

8. The level shifter circuit of claim 7, wherein the first switch is an N-channel metal-oxide-semiconductor (NMOS) transistor, and its drain is coupled to the output end, its source is couple to the first voltage source, and its gate receives the input signal.

9. The level shifter circuit of claim 7, wherein each second switch is a P-channel metal-oxide-semiconductor (PMOS) transistor, and its gate receives an output signal of the (K−1) output signals.

10. The level shifter circuit of claim 6, being applied to a digital-to-analog converter.

* * * * *